(12) United States Patent
Stevenson et al.

(10) Patent No.: US 7,749,406 B2
(45) Date of Patent: *Jul. 6, 2010

(54) SIO$_x$:SI SPUTTERING TARGETS AND METHOD OF MAKING AND USING SUCH TARGETS

(76) Inventors: David E. Stevenson, 9365 Hidden Lake Cir., Dexter, MI (US) 48130; Li Q. Zhou, 2915 Aspen Ridge Dr., Ann Arbor, MI (US) 48103

( * ) Notice: Subject to any disclaimer, the term of this patent is extended or adjusted under 35 U.S.C. 154(b) by 1120 days.

This patent is subject to a terminal disclaimer.

(21) Appl. No.: 11/201,782

(22) Filed: Aug. 11, 2005

(65) Prior Publication Data

US 2007/0034500 A1      Feb. 15, 2007

(51) Int. Cl.
*C23C 14/34* (2006.01)
*H01B 1/16* (2006.01)
*B22F 5/00* (2006.01)
*B22F 3/15* (2006.01)

(52) U.S. Cl. ............ 252/500; 204/192.23; 204/298.12; 204/298.13; 428/403; 419/10; 419/19; 419/49

(58) Field of Classification Search ............ 204/298.12, 204/298.13; 252/500, 521.3; 501/53, 104, 501/154; 257/22; 438/667, 758, 3; 423/335, 423/348

See application file for complete search history.

(56) References Cited

U.S. PATENT DOCUMENTS

| | | | |
|---|---|---|---|
| 3,849,344 A | | 11/1974 | McMurtry et al. |
| 4,375,443 A | | 3/1983 | Kipperman et al. |
| 4,451,969 A | | 6/1984 | Chaudhuri |
| 4,859,553 A | | 8/1989 | Jansen et al. |
| 5,320,729 A | * | 6/1994 | Narizuka et al. ....... 204/298.13 |
| 6,177,284 B1 | * | 1/2001 | Horii et al. ..................... 438/3 |
| 6,616,890 B2 | | 9/2003 | McPhillips |
| 6,730,934 B2 | * | 5/2004 | Yamada et al. ................ 257/79 |
| 6,911,163 B2 | | 6/2005 | Abe |
| 7,037,581 B2 | * | 5/2006 | Aramata et al. ............. 428/402 |
| 2002/0190048 A1 | | 12/2002 | McPhillips |
| 2003/0118905 A1 | | 6/2003 | Fukuoka et al. |
| 2004/0182700 A1 | * | 9/2004 | Natsume et al. ........ 204/298.13 |
| 2007/0034500 A1 | | 2/2007 | Stevenson et al. |
| 2007/0034837 A1 | | 2/2007 | Stevenson et al. |
| 2007/0037404 A1 | | 2/2007 | Stevenson et al. |

FOREIGN PATENT DOCUMENTS

| | | | |
|---|---|---|---|
| JP | 60-178618 | * | 8/1985 |
| JP | 63166965 A | | 7/1988 |
| JP | 05-005117 A | | 7/1991 |

(Continued)

*Primary Examiner*—Stanley Silverman
*Assistant Examiner*—Kallambella Vijayakumar
(74) *Attorney, Agent, or Firm*—Robert L. Stearns; Dickinson Wright, PLLC

(57) ABSTRACT

Silicon oxide and electrically conductive doped silicon materials are joined in a protective environment to yield a composite SiO$_x$:Si material that exhibits the properties of SiO$_x$, and yet is electrically conductive due to the presence of the Si. Such a composite material finds use as a target for DC and/or AC sputtering processes to produce silicon oxide thin films for touch-screen applications, barrier thin films in LCD displays and optical thin films used in a wide variety of applications.

23 Claims, 1 Drawing Sheet

FOREIGN PATENT DOCUMENTS

| | | | |
|---|---|---|---|
| JP | 05-005177 A3 | | 7/1991 |
| JP | 04-028858 | * | 1/1992 |
| JP | 04-028858 A | | 1/1992 |
| JP | 10-062776 | | 3/1998 |
| JP | 2002-313307 | * | 10/2002 |
| JP | 2004-119615 | | 4/2004 |
| JP | 2004-323324 | * | 11/2004 |
| WO | WO 03/082769 | * | 10/2003 |
| WO | WO 2004/048289 | * | 6/2004 |

* cited by examiner

SIO$_x$:SI SPUTTERING TARGETS AND METHOD OF MAKING AND USING SUCH TARGETS

BACKGROUND OF THE INVENTION

1. Technical Field

This invention relates to AC or DC sputtering targets used for thin film deposition of SiO$_x$.

2. Related Art

Many architectural, automotive, integrated circuit, flat panel display and optical devices require thin films of oxides of silicon, such as silicon dioxide (SiO$_2$). One of the principal methods for producing such thin films is by a physical vapor deposition process known as radio frequency sputtering. This method utilizes non-conductive silicon dioxide material as the source material for the creation of the silicon dioxide thin film coatings. A high frequency ac-voltage, typically 13.56 MHz is applied capacitively to the target. In one phase, gas ions of the plasma are accelerated toward the target and cause material at the surface of the target to be detached as a result of the bombardment with the gas ions. In the other phase, the charge on the target surface is neutralized with the result that no sputtering occurs during this periodic phase. Although this method produces suitable silicon dioxide thin film coatings, it has the limitations of requiring the use of expensive and complex high frequency power supplies, low deposition rates for the formation of the SiO$_2$ thin film coatings, and inherent limitations on the uniformity of SiO$_2$ coatings on large size substrates.

Direct current (DC including pulsed DC) or medium to low frequency alternating current (AC) sputtering processes do not have such limitations. However, DC and AC processes require that the silicon source material for the SiO$_2$ coating be made electrically conductive either by doping them with a suitable dopant such as boron, or by the addition of small amounts of aluminum or other suitable metals. To use such silicon targets to create SiO$_2$ thin films via DC or AC sputtering also requires that large amounts of oxygen be introduced into the sputtering process. The resultant process is referred to as reactive sputtering. The oxygen reacts with the silicon during the sputtering process to yield SiO$_2$. To create SiO$_2$ films typically requires that O$_2$ gas pressure be 30-50% of the total gas pressure in the vacuum chamber. This can result in a significant process mismatch in terms of the oxygen requirements, as compared to that required for other sputtered thin films which may be deposited using the same vacuum vessel. In addition, SiO$_2$ films made by DC and AC sputtering from silicon or Si:Al targets generally are not sufficiently dense and crystalline as a result of the characteristics of reactive deposition to render them suitable for many semi-conductor, flat panel and opto-electronics applications. The SiO$_2$ film compositions produced by such reactive processes generally exhibit less useful optical, mechanical and chemical durability properties compared to those produced by RF sputtering of non-conductive SiO$_2$ targets.

SUMMARY OF THE INVENTION

It is an object of the present invention to produce SiO$_x$-based material compositions that include a sufficient amount of silicon to render the composition electrically conductive. The SiO$_x$:Si material compositions are well suited as targets for use in DC or AC sputtering processes to produce high quality SiO$_x$ thin film coatings with the addition of only small amounts of O$_2$ during the deposition process, since the presence of SiOx in the target material serves as a source of oxygen in the vessel thereby decreasing the amount of oxygen gas that typically needs to be fed into the vessel during reactive sputtering DC or AC processes. This enables the production efficiencies of DC and AC sputtering to be used to produce SiO$_x$ coatings equivalent to those produced by the less efficient and more costly RF sputtering method.

The SiO$_x$:Si material of the invention is composed of the constituent materials of electrically non-conductive SiO$_x$ and an amount of Si that has been doped and combined with the SiOx in a manner that physically unites the materials to render the overall SiO$_x$-based composition electrically conductive. In some embodiments, there can be the addition of one or more metals in amounts smaller than that of the Si component. These material compositions, although primarily composed of insulating silicon oxide, exhibit good electrical conductivity while retaining many of the other intrinsic material properties of the silicon oxide. Such materials can be fabricated in solid bulk forms such as plates, rods and tubes. In addition these bulk materials can be reduced to powder form with such powders retaining the electrically conductive properties of the bulk material for use alone or with other materials in the formation of sputtering targets. The invention also contemplates that the Si can be doped by various post-treatment methods after it has been sintered with SiO$_x$, if desired.

Accordingly, it is an object of the present invention to produce sputtering targets from a composite SiO$_x$:Si material which, although primarily composed of insulating SiO$_x$ material, has good electrical conductivity due to the presence of the conductive Si material. The electronic properties of this material can be adjusted based on the ratio of the constituents of electrically conductive doped Si, SiO$_x$ and in some embodiments small fractions of various metals.

BRIEF DESCRIPTION OF THE DRAWINGS

These and other features and advantages of the present invention will become more readily appreciated when considered in connection with the following detailed description and appended drawings, wherein.

DETAILED DESCRIPTION OF THE PREFERRED EMBODIMENT

Figure 1:
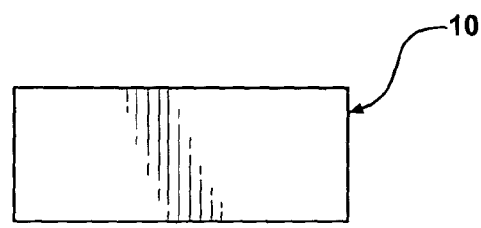
FIG. 1 is a schematic illustration of a sputtering target made of the Si:SiO$_x$ material.

The present invention is directed to the formation of sputtering targets from composite silicon oxide:silicon (SiO$_x$:Si) material that is rendered conductive by the selection of starting materials and the process by which they are combined to form the composite.

According to the fundamental principals of the present invention, the process starts out with oxide of silicon SiO$_x$ powder (such as SiO$_2$) which in and of itself is substantially electrically non-conductive, but which is combined with electrically conductive Si in a manner that protects the Si against substantial oxidation while uniting it to the SiO$_x$ material to render the overall composite electrically conductive while preserving the characteristics of each of the SiO$_x$ and Si materials.

An approach contemplated by the invention starts out with a blend of SiO$_x$ and conductive Si powders. The blended powder is compacted and sintered to form a sputtering target suitable for use in a DC or AC thin film sputtering process.

According to one aspect of the invention, the conductive silicon component of the powder blend is prepared by crushing and then grinding a doped silicon crystal (such as p-type boron doped silicon) to powder. As is well known to those skilled in the art, the doping of the silicon material is achieved by adding a suitable n or p dopant to the molten silicon prior to growing the single or poly phase crystal of silicon. The concentration and uniformity of these dopant atoms determine the specific electrical characteristics of the silicon.

The invention contemplates that various approaches can be employed to blend the particles of silicon oxide and conductive silicon and that variations can occur in the size of the particles and the ratio of the silicon oxide to doped silicon particles in order to alter the electrical conductive properties or resistivity of the target. In the first presently preferred embodiment, the composition of the base silicon oxide powder is greater than 50% by weight, and that of the conductive silicon powder is greater than 10% by weight, with the silicon oxide preferably making up the majority of the powder blend. According to a presently preferred process, the powders may be blended together in a pot using zirconia balls as milling media until the particle size of the blended powder is reduced to less than 5 µm. Once the powder has been sufficiently blended, it is preferably placed in a metal containment unit and then heated under vacuum conditions to eliminate residual moisture. Following heating to drive off the moisture, the containment unit is preferably sealed and then placed in a hot isostatic chamber and then heated to a sufficient temperature and pressure to densify and sinter the silicon oxide and doped silicon particles. For this purpose, the container is preferably one which can withstand the heat and pressure of the hot isostatic-pressing environment, but which flows plastically under the heat and pressure so as to consolidate and densify the powder material contained within the container. Once densified, the resultant fused, densified article of silicon oxide-doped silicon material is removed from the container. The resulting composition is preferably densified to at least 90% of theoretical density, and preferably at least 95% of full theoretical density, and still more preferably greater than 99% of full theoretical density. According to a preferred process, the powder is subjected to hot isostatic pressure (HIP) at temperatures of between 1200 to 1450° C. and under pressures exceeding 10 kpsi. More particularly, the preferred process involves hot isostatic press heating to 1000° C. under vacuum conditions and then gradually applying the pressure to more than 20 kpsi while increasing the temperature to between 1200 to 1450° C. According to a further feature of the invention, the resultant sintered article 10 has a resistivity value of less than 2000Ω·cm. Preferably, the article or target has resistivity less than 200Ω·cm and still more preferably below 20Ω·cm and still further more preferably at or below 10Ω·cm. Accordingly, the range of resistivity contemplated by the invention is in the range of about 10Ω·cm or less to about 500Ω·cm.

Figure 2:
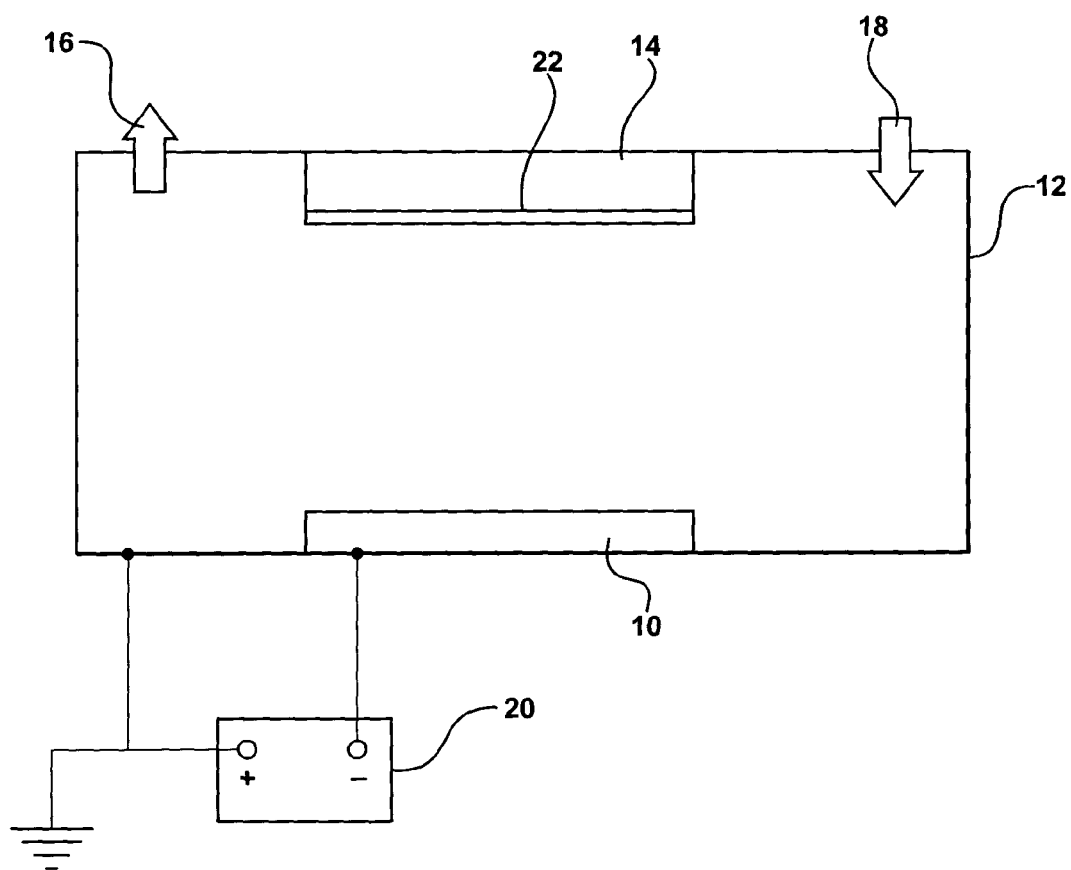
FIG. 2 is a schematic illustration of a DC sputtering process employing a target of the Si:SiO$_x$ material.

FIG. 1 schematically illustrates a target made of the inventive material. FIG. 2 schematically illustrates the target in use in a DC sputtering process. Those skilled in the art will appreciate that the AC sputtering process is quite similar except for the power source, so an explanation of the process in connection with the DC sputtering example will suffice for the AC process as well.

The material for the target can be prepared by reground sintered $SiO_x$:Si material resulting from the process described above, or may be formed from a process in which $SiO_x$ particles are substantially coated with molten electrically conductive Si in a protective non-oxidizing atmosphere such as argon to cause the Si to encapsulate and fuse with the $SiO_x$ particles while protecting the molten Si against oxidation in the process. The resultant composite particles can be mixed with other such particles and/or blended with an amount of uncoated silicon oxide particles and thereafter sintered to form an article. The amount of the conductive composite particles will be that amount which is needed to achieve the desired electrical conductivity properties. For example, the invention contemplates that enough of the composite particles are present to provide a conductive path through the bulk of the sintered material as necessary for the particular target to be produced.

The invention contemplates that various manufacturing methods can be used to prepare the material that yield the same desirable characteristics and properties described above. These alternative methods can be used with or without the hot isostatic pressing. Such additional processes include vacuum plasma spraying of the Si material onto the $SiO_x$ material in an inert gas atmosphere to preclude oxidizing the Si; vacuum casting ("melt casting") of the materials to connect Si grains of the blend in the presence of the $SiO_x$ grains to yield a conductive network; vacuum hot pressing of the materials in an inert gas atmosphere; and inert gas microwave melting and solidification.

The invention also contemplates various post-treatment methods for rendering the Si conductive in the company of $SiO_2$. In this case the Si is alone in powder form or united with the $SiO_x$ in reground powder form, with the Si initially being non-conductive. One alternative approach for making the silicon conductive is by means of thermal gas diffusion in non-oxygen atmosphere using a gas such as Arsine, $AsH_3$ composition. Another approach is ion implantation with dopants such as Boron. It is also contemplated that the dopant such as Arsenic, Gallium, or Phosphorous could be added in powder form to reground non-conductive Si:$SiO_x$ powder and then sintered in a non-oxygen atmosphere. Still another approach to post-treatment doping of initially non-conductive Si is to mix metal powder such as Al, Mg, Sn, In, Mn, Zn, Bi, Cd, Se, and/or Ga with reground non-conductive Si:$SiO_x$ powder and then sinter in a non-oxygen atmosphere.

The invention also contemplates that additional material can be added to the Si:$SiO_x$ in order to tailor the end properties. For example, to improve density, one could add Al, Mg, Sn, In, Zn, Bi, Sr, Cd, Se and/or Ga. To improve ductility, one could add Al, Mg, Sn, In, Zn, Ga, Se and/or Cd. To alter the refractive index of the Si:$SiO_x$ material, on could add Al and/or Sr. To improve toughness, one could add Al, Mg and/or Se. In each case, the base Si:$SiO_x$ material is itself electrically conductive.

Once the target is prepared, it can be used in a direct current (DC) or low to medium frequency alternating (AC) sputtering process. FIG. 1 shows the article at 10 fabricated of the blended and joined silicon oxide-doped silicon powder as described above. FIG. 2 shows the article 10 disposed in a DC sputtering process 12 adjacent a substrate 14. A vacuum 16 is drawn on the chamber 12 and then back filled with an inert gas environment, such as argon through a gas inflow 18. The target 10 is coupled electrically to a DC power source 20. When energized, the argon within the chamber 12 is ionized in a plasma gas. A large negative voltage potential applied to the target draws the positive argon ions to the target 10 under accelerated conditions, knocking particles from the target 10 which are deposited onto the substrate 14, developing a deposited thin film or layer 22 of the target material 10 onto the substrate. During DC sputtering, a relatively small amount or flow of oxygen may be fed to the chamber 12 through the gas inflow 18. The oxygen becomes a component of the plasma gas and reacts with the silicon to generate a silicon oxide coating 22 on the substrate. The amount or level of oxygen that would otherwise be required if the target were purely doped silicon is significantly reduced since the presence of the silicon oxide in the target material 10 eliminates the need to provide a source of oxygen to convert that portion of the material to silicon oxide for deposition onto the substrate 14. It will be appreciated that there are a number of parameters which will affect the level of oxygen required, including the ratio of silicon oxide to silicon any conditions under which the DC sputtering takes place. Nonetheless, under the same operating conditions, a target manufactured according to the invention including silicon oxide and doped silicon will require less oxygen in the DC sputtering process than that of an equivalent target made only of doped silicon.

Obviously, many modifications and variations of the present invention are possible in light of the above teachings. It is, therefore, to be understood that within the scope of the appended claims, the invention may be practiced otherwise than as specifically described. The invention is defined by the claims.

What is claimed is:

1. A conductive sputtering target, comprising:
a combination of particles of an oxide of silicon consisting of $SiO_2$ and conductive-doped silicon particles uniformly mixed and sintered in a compact having at least 70% of full theoretical density and having a resistivity of less than 2000 Ω·cm or less and wherein the particles retain their particulate form following sintering.

2. The target of claim 1, wherein said blend has between 50 to 80% by weight silicon oxide.

3. The target of claim 1 wherein said sintered compact has a density of between 70% and 99% of full theoretical density.

4. The target of claim 1 wherein the resistivity is about *200 Ω·cm or less*.

5. The target of claim 1 wherein the resistivity is about 20 Ω·cm or less.

6. The target of claim 1 wherein the resistivity is about 10 Ω·cm or less.

7. The target of claim 1 wherein said compact includes at least one metal additive selected from the group consisting of: Al, Mg, Sn, In, Mn, Zn, Bi, Sr, Cd, Se and Ga.

8. A method of manufacturing a conductive sputtering target, comprising:
sintering a combination of uniformly mixed and compacted silicon oxide particles consisting of $SiO_2$ and silicon particles to at least 70% of full theoretical density and having a resistivity of about 2000 Ωcm or less, and wherein the silicon particles in the combination are doped to render them conductive in order to render the combination conductive and wherein the $SiO_2$, and silicon articles retain their particulate form following sintering.

9. The method of claim 8 wherein the target is prepared with a resistivity of about 200 Ω·cm or less.

10. The method of claim 8 wherein the target is prepared with a resistivity of about 20 Ω·cm or less.

11. The method of claim 8 wherein the target is prepared with a resistivity of about 10 Ω·cm or less.

12. The method of claim 8 wherein the particles of the combination have a particle size of about 5 μm or less.

13. The method of claim 8 wherein the $SiO_2$ is present in an amount equal to about 50 to 80% by weight of the combination.

14. The method of claim 8 wherein the combination of silicon oxide and silicon particles is subjected to hot isostatic pressing.

15. The method of claim 14 wherein the hot isostatic pressing is carried out at a temperature of between about 1200 to 1450° C. and at pressures of at least 10 kpsi.

16. The method of claim 8 wherein the Si particles are prepared by doping the Si particles to render them electrically conductive before being combined with the $SiO_2$ particles.

17. The method of claim 8 wherein the Si particles are prepared by doping the Si particles to render them electrically conductive after being combined with the $SiO_2$ particles.

18. The method of claim 8 including adding at least one metal additive selected from the group consisting of: Al, Mg, Sn, In, Mn, Zn, Bi, Sr, Cd, Se and Ga.

19. A method of sputtering an oxide of silicon onto a substrate, comprising:
preparing a sputtering target of a combination of uniformly mixed and sintered silicon oxide particle consisting of $SiO_2$ and conductive-doped silicon particles in which the $SiO_2$ and silicon particles retain their particulate form following sintering;
placing the sputtering target in a chamber containing a sputtering device located in proximity to the substrate to be coated; and
operating the sputtering device to deposit a sputtered oxide of silicon onto the substrate from the target.

20. The method of claim 19 wherein the sputtering process is carried out in an inert atmosphere.

21. The method of claim 20 wherein the inert atmosphere is selected as argon.

22. The method of claim 20 wherein the inert atmosphere is selected as argon and including an amount of oxygen to react with silicon sputtered from the target to produce an oxide of silicon for sputtering on the substrate.

23. The method of claim 20 wherein the $SiO_2$ is present in the target in an amount between 50% to 80% by weight of the target material.

* * * * *